United States Patent
Barber et al.

(10) Patent No.: US 7,602,102 B1
(45) Date of Patent: Oct. 13, 2009

(54) BULK ACOUSTIC WAVE RESONATOR WITH CONTROLLED THICKNESS REGION HAVING CONTROLLED ELECTROMECHANICAL COUPLING

(75) Inventors: Bradley P. Barber, Acton, MA (US); Frank Bi, Shrewsbury, MA (US); Craig E. Carpenter, Shirley, MA (US)

(73) Assignee: Skyworks Solutions, Inc., Woburn, MA (US)

( * ) Notice: Subject to any disclaimer, the term of this patent is extended or adjusted under 35 U.S.C. 154(b) by 48 days.

(21) Appl. No.: 12/150,240

(22) Filed: Apr. 24, 2008

(51) Int. Cl.
    *H01L 41/08* (2006.01)
(52) U.S. Cl. .................. 310/320; 310/321; 310/364
(58) Field of Classification Search ......... 310/320–322, 310/363–365
    See application file for complete search history.

(56) References Cited

U.S. PATENT DOCUMENTS

| | | | |
|---|---|---|---|
| 3,363,119 A * | 1/1968 | Koneval et al. | 310/320 |
| 3,365,591 A * | 1/1968 | Curran et al. | 310/320 |
| 3,401,276 A * | 9/1968 | Curran et al. | 310/320 |
| 6,420,202 B1 | 7/2002 | Barber et al. | |
| 6,812,619 B1 | 11/2004 | Kaitila et al. | |
| 6,933,809 B2 | 8/2005 | Kyoung et al. | |
| 7,323,953 B2 * | 1/2008 | Yokoyama et al. | 333/187 |
| 7,482,737 B2 | 1/2009 | Yamada et al. | |
| 2002/0121840 A1* | 9/2002 | Larson et al. | 310/312 |
| 2005/0140247 A1* | 6/2005 | Lee | 310/320 |
| 2006/0103492 A1* | 5/2006 | Feng et al. | 333/187 |
| 2008/0157629 A1 | 7/2008 | Noguchi et al. | |

FOREIGN PATENT DOCUMENTS

WO    2005008889    1/2005

* cited by examiner

*Primary Examiner*—Thomas M Dougherty
(74) *Attorney, Agent, or Firm*—Lando & Anastasi, LLP

(57) ABSTRACT

According to an exemplary embodiment, a bulk acoustic wave (BAW) resonator includes a piezoelectric layer situated between upper and lower electrodes, where each of the upper and lower electrodes are a high density metal. The BAW resonator further includes a controlled thickness region including a low density metal segment, where the low density metal segment is situated adjacent to the piezoelectric layer, and where the controlled thickness region has controlled electromechanical coupling. The controlled thickness region can provide reduced electromechanical coupling into lateral modes. The low density metal segment can extend along the perimeter of the BAW resonator.

20 Claims, 6 Drawing Sheets

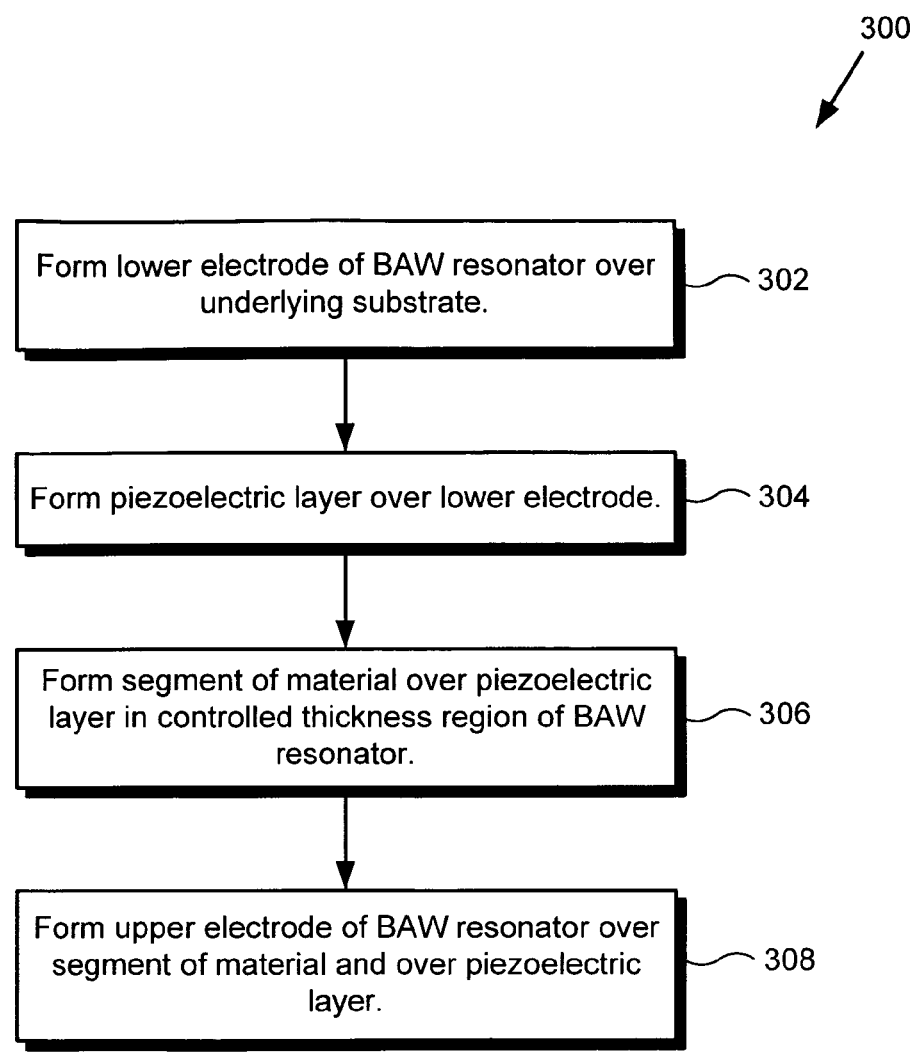

BULK ACOUSTIC WAVE RESONATOR WITH CONTROLLED THICKNESS REGION HAVING CONTROLLED ELECTROMECHANICAL COUPLING

BACKGROUND OF THE INVENTION

1. Field of the Invention

The present invention generally relates to the field of electronics. More particularly, the invention relates to bulk acoustic wave (BAW) resonators.

2. Background Art

Because of their small footprint, low profile, and high performance, bulk acoustic wave (BAW) filters are increasingly utilized to provide radio frequency (RF) filtering in mobile electronic devices, such as cellular phones, as well as other types of electronic devices. BAW filters can include a number of BAW resonators, where each BAW resonator typically includes a layer of piezoelectric material, such as aluminum nitride, sandwiched between upper and lower electrodes. When an electric field is applied across the upper and lower electrodes of the BAW resonator, the electric field can cause the layer of piezoelectric material to vibrate. As a result, the piezoelectric material can generate a number of allowed modes of acoustic wave propagation, which include a desired longitudinal mode. However, unwanted excitation of energy in modes of wave propagation that have high energy loss, such as lateral modes, can cause a significant loss of energy in a BAW resonator and, thereby, undesirably lower the BAW resonator's quality factor (Q).

Conventional approaches to reducing energy loss in a BAW resonator include shaping the profile of the resonator such that the energy is best contained and controlled in a desired longitudinal mode. In one conventional profile shaping approach, a shaped region can be provided close to the edge of the BAW resonator, which is a region of high energy loss, to reduce the amount of energy that is excited in lossy modes of wave propagation in the BAW resonator. However, the shaped region provided in this conventional approach can also introduce additional unwanted modes, such as lateral modes contained within the shaped region, which can cause energy loss in the BAW resonator.

SUMMARY OF THE INVENTION

A bulk acoustic wave resonator with controlled thickness region having controlled electromechanical coupling, substantially as shown in and/or described in connection with at least one of the figures, as set forth more completely in the claims.

BRIEF DESCRIPTION OF THE DRAWINGS

FIG. 3 is a flowchart illustrating an exemplary method for fabricating a BAW resonator in accordance with one embodiment of the present invention.

DETAILED DESCRIPTION OF THE INVENTION

The present invention is directed to a bulk acoustic wave resonator with controlled thickness region having controlled electromechanical coupling. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the invention which use the principles of the present invention are not specifically described in the present application and are not specifically illustrated by the present drawings.

Figure 1A:
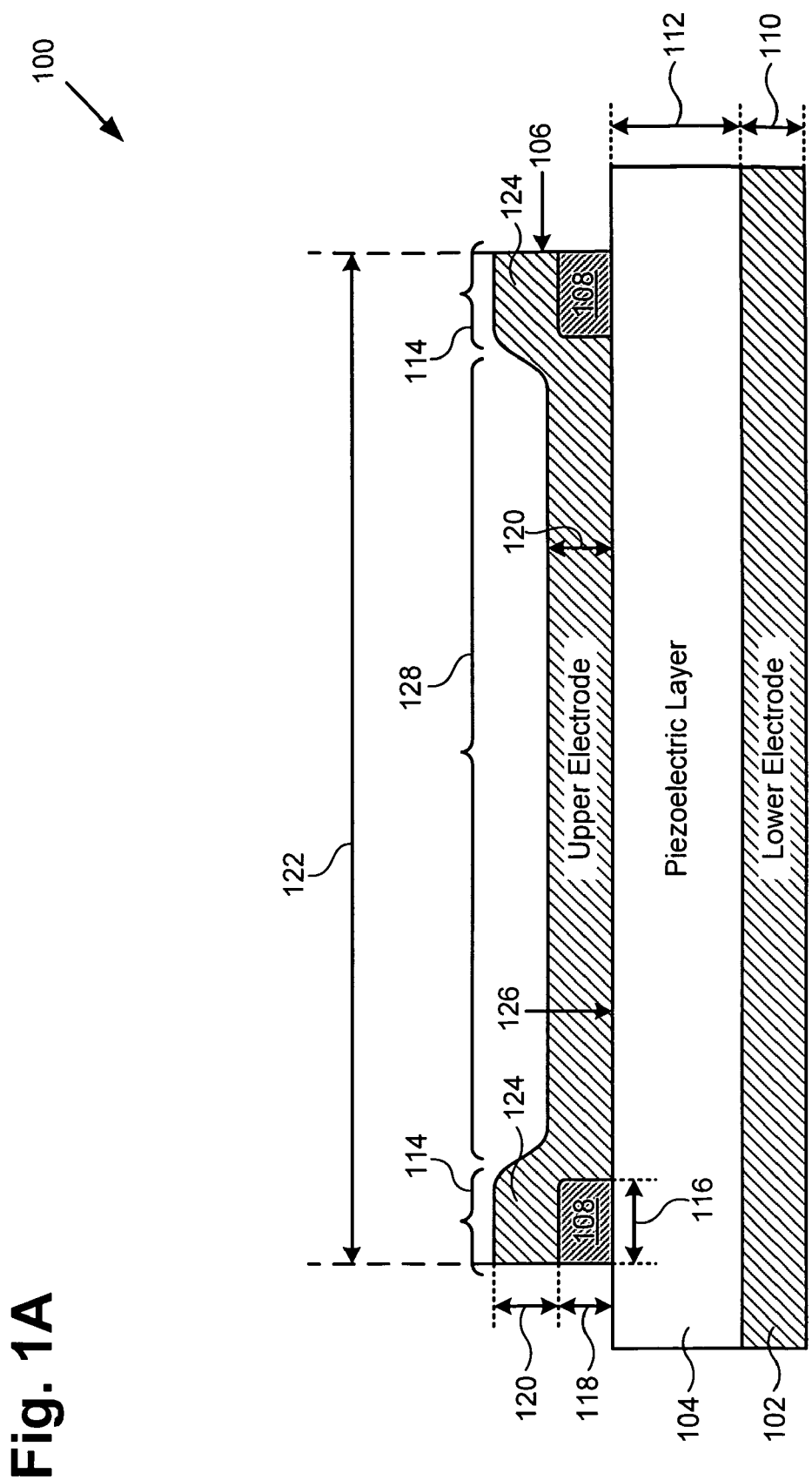
FIG. 1A illustrates a cross-sectional view of an exemplary bulk acoustic wave (BAW) resonator, in accordance with one embodiment of the present invention.

FIG. 1A shows a cross-sectional view of BAW resonator 100, in accordance with one embodiment of the present invention. Certain details and features have been left out of FIG. 1A, which are apparent to a person of ordinary skill in the art. BAW resonator 100 includes lower electrode 102, piezoelectric layer 104, upper electrode 106, and low density metal segment 108. BAW resonator 100 can further include an acoustic mirror, which provides acoustic isolation from an underlying substrate. The acoustic mirror and substrate over which BAW resonator 100 is fabricated are not shown in FIG. 1A so as not to obscure the invention. In one embodiment, BAW resonator 100 can be a film bulk acoustic resonator (FBAR) and can be acoustically isolated from an underlying substrate by an air cavity. BAW resonator 100 can be utilized in a BAW filter to provide RF filtering in a cellular phone or other type of semiconductor device and can be fabricated in a semiconductor die.

As shown in FIG. 1A, lower electrode 102 can be situated over, for example, an acoustic mirror, which is not shown in FIG. 1A, and can comprise tungsten, molybdenum, or other suitable metal having a high density, i.e., a high density metal. Lower electrode 102 has thickness 110, which can be, for example, between 500.0 Angstroms and 5000.0 Angstroms. Lower electrode 102 can be formed by depositing a layer of high density metal, such as tungsten or molybdenum, over an underlying layer of material (not shown in FIG. 1A) by utilizing a physical vapor deposition (PVD) or sputtering process or other suitable deposition process and appropriately patterning the layer of high density metal.

Also shown in FIG. 1A, piezoelectric layer 104 is situated over lower electrode 102, and can comprise aluminum nitride (AlN) or other suitable piezoelectric material, and has top surface 126. A seed layer (not shown in FIG. 1A) can be situated between piezoelectric layer 104 and lower electrode 102. Piezoelectric layer 104 has thickness 112, which can be, for example, between 0.5 microns and 3.0 microns. Piezoelectric layer 104 can be formed by, for example, depositing a layer of aluminum nitride over lower electrode 102 by utilizing a PVD or sputtering process, a chemical vapor deposition (CVD) process, or other suitable deposition process.

Further shown in FIG. 1A, low density metal segment 108 is situated over piezoelectric layer 104 in controlled thickness region 114 of BAW resonator 100. Low density metal segment 108 can comprise aluminum, titanium, or other suitable low density metal and has width 116 and thickness 118. In the present embodiment, low density metal segment 108 is situated at the edge of BAW resonator 100, extends along the entire perimeter of the BAW resonator, and has a rectangular cross-sectional shape. In another embodiment, low density metal segment 108 can be situated in a position other than at the edge of BAW resonator 100. In other embodiments, low density metal segment 108 may have a non-rectangular cross-sectional shape. Low density metal segment 108 has width 116 (i.e. a cross-sectional width), which can be, for example, between 1.0 micron and 5.0 microns. Low density metal segment 108 has thickness 118, which can be, for example, between 100.0 Angstroms and 3000.0 Angstroms. It is noted that although low density metal segment 108 is shown as being thinner than upper electrode 106 for simplicity of illustration, low density metal segment 108 can also be thicker than or approximately equal in thickness to upper electrode 106.

Low density metal segment 108 can be formed by depositing a layer of low density metal, such as aluminum or titanium, over piezoelectric layer 104 by utilizing a PVD or sputtering process or other suitable deposition process. The layer of low density metal can then be appropriately patterned by utilizing a suitable etch process to form the inner edge of low density metal segment 108 by removing a center portion of the low density metal layer. In the present embodiment, the outer edge of low density metal segment 108 can be self-aligned with the edge of upper electrode 106 by forming the outer edge of low density metal segment 108 concurrently with the edge of upper electrode 106 as discussed below. In one embodiment, the layer of low density metal can be appropriately patterned by utilizing a suitable etch process to form the inner and outer edges of low density metal segment 108. In that embodiment, upper electrode 106 can overlap the outer edge of low density metal segment 108 or be contained entirely within its boundary.

Also shown in FIG. 1A, upper electrode 106 is situated over piezoelectric layer 104 and low density metal segment 108 and can comprise tungsten, molybdenum, or other suitable high density metal. Upper electrode 106 has thickness 120, which can be, for example, between 500.0 Angstroms and 5000.0 Angstroms. Upper electrode 106 has width 122, which can be less than the width of lower electrode 102 and which defines the approximate width of the "active portion" of BAW resonator 100. The "active portion" of BAW resonator 100 refers to the portion of piezoelectric layer 104 in which an electric field is applied to activate the resonator. Upper electrode 106 can be formed by depositing a layer of high density metal, such as tungsten or molybdenum, over piezoelectric layer 104 and low density metal segment 108 by utilizing a PVD or sputtering process or other suitable deposition process.

In the embodiment in FIG. 1A, the layer of high density metal can be appropriately patterned by etching the layer of high density metal concurrently with the underlying layer of low density metal (utilized to form low density metal segment 108) in the same etch process, thereby providing a precisely defined edge of BAW resonator 100. Thus, in the present embodiment, the edge of upper electrode 106 is self-aligned with the outer edge of low density metal segment 108. In one embodiment, the layer of high density metal can overlap the previously formed outer edge of low density metal segment 108 and can be appropriately patterned by utilizing a suitable etch process.

Further shown in FIG. 1A, controlled thickness region 114 is situated at the edge of BAW resonator 100, extends along the edge of BAW resonator 100, and includes low density metal segment 108 and portion 124 of upper electrode 106, which overlies low density metal segment 108. In another embodiment, controlled thickness region 114 can be formed at a location in BAW resonator 100 other than at the edge of the resonator. Also shown in FIG. 1A, high density metal region 128 of BAW resonator 100 is situated adjacent to and surrounded by controlled thickness region 114. In high density metal region 128, upper electrode 106 is situated on piezoelectric layer 104. Thus, in high density metal region 128, a low density metal segment, such as low density metal segment 108 is not disposed between upper electrode 106 and piezoelectric layer 104.

Figure 1B:
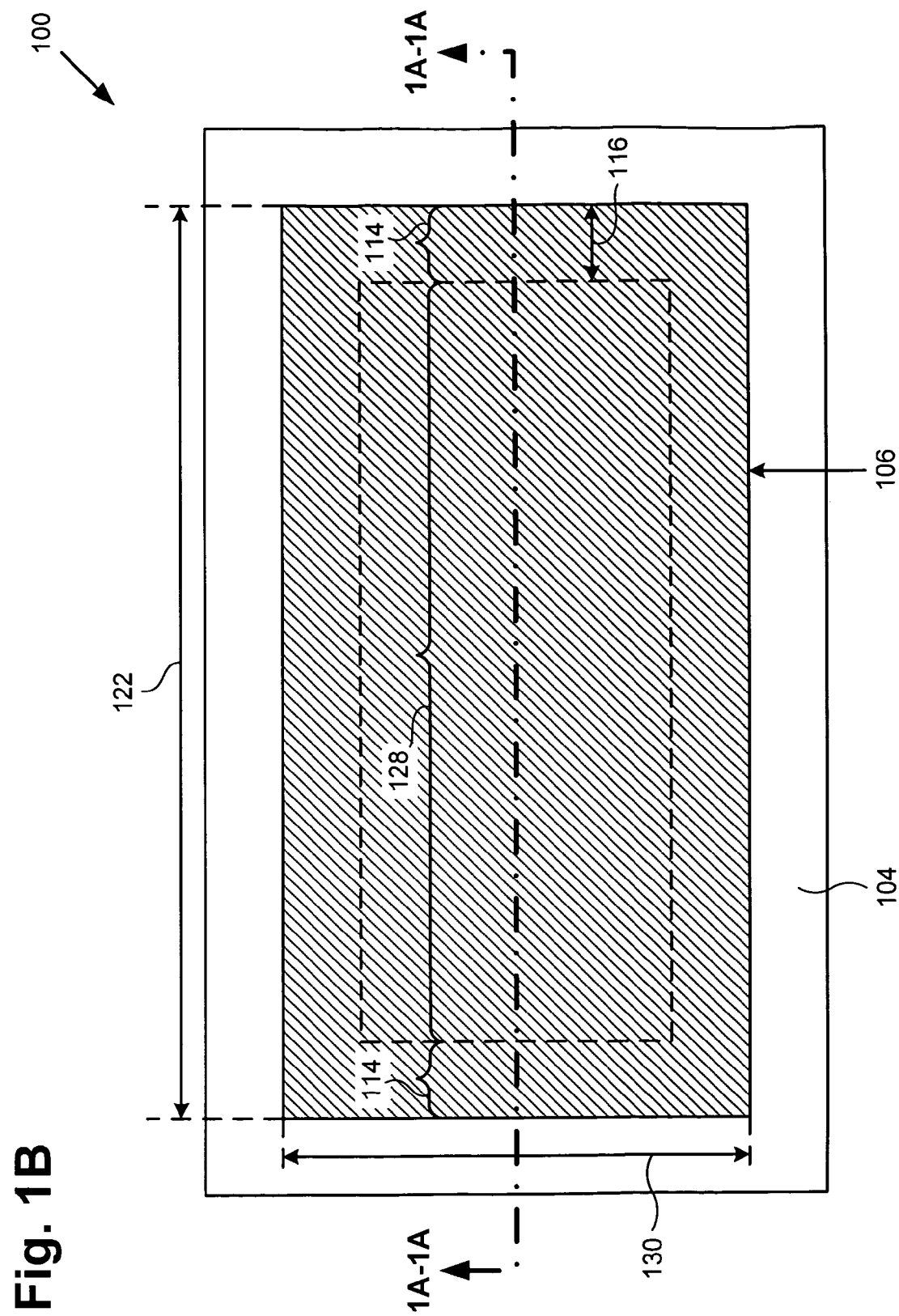
FIG. 1B illustrates a top view of the exemplary BAW resonator of FIG. 1A.

FIG. 1B shows a top view of structure 100, where the cross-sectional view of BAW resonator 100 in FIG. 1A is across line 1A-1A in FIG. 1B. In particular, piezoelectric layer 104, upper electrode 106, controlled thickness region 114, widths 116 and 122, and high density metal region 128 correspond to the same elements in FIG. 1A and FIG. 1B. As shown in FIG. 1B, upper electrode 106 has depth 130, which define the approximate depth of the active region of BAW resonator 100. In the embodiment in FIGS. 1A and 1B, BAW resonator 100 has a rectangular shape. In one embodiment, BAW resonator 100 can have a square shape, wherein width 122 is approximately equal to depth 130. There can also be advantages to rounding the BAW resonator's corners and/or forming the resonator such that opposite sides of the resonator are not parallel. As shown in FIG. 1B, controlled thickness region 114 is situated at the edge of BAW resonator 100, extends along the resonator's perimeter, and has a width that is defined by width 116 of low density metal segment 108 (shown in FIG. 1A). Also shown in FIG. 1B, high density metal region 128 of BAW resonator 100 is situated adjacent to and enclosed by controlled thickness region 114.

The operation of BAW resonator 100 will now be discussed. When an electric field is applied across piezoelectric layer 104 via upper electrode 106 and lower electrode 102, electrical energy is converted into acoustic energy in piezoelectric layer 104 through electromechanical coupling, thereby causing piezoelectric layer 104 to vibrate. As a result, piezoelectric layer 104 can generate acoustic waves that can propagate in a longitudinal mode, i.e., in a direction perpendicular to top surface 126 of piezoelectric layer 104, which is a desired mode. However, as a result of the crystalline structure of piezoelectric layer 104, the edge region of BAW resonator 100, and other factors, a multitude of other, unwanted modes of acoustic wave propagation can also be generated in piezoelectric layer 104. For example, unwanted modes such as lateral modes, i.e., modes of acoustic wave propagation that occur in a direction parallel to top surface 126 of piezoelectric layer 104, can be generated in piezoelectric layer 104. As discussed above, a significant loss of energy in BAW resonators can occur as a result of coupling energy into unwanted modes, such as lateral modes. In particular, the edge of a BAW resonator, such as BAW resonator 100, is a lossy region of the resonator wherein coupling into unwanted, lossy modes, such as lateral modes, can undesirably increase energy loss in the BAW resonator.

In an embodiment of the invention's BAW resonator 100, controlled thickness region 114 provides thickness shaping at the edge of BAW resonator 100 by adding low density metal segment 108 between upper electrode 106 and piezoelectric layer 104 to increase the thickness at edge of the resonator, thereby reducing energy loss into unwanted modes, such as lateral modes, by suppressing the unwanted modes. By utilizing a low density metal, such as aluminum or titanium, to form low density metal segment 108, where the low density metal has a lower density than the high density metal utilized to form upper electrode 106, electromechanical coupling can be significantly reduced in controlled thickness region 114. Thus, electromechanical coupling into unwanted modes, such as lateral modes, as well as coupling into the desired longitudinal mode, can be significantly reduced in controlled thickness region 114. However, the modest overall loss of coupling into the longitudinal mode in BAW resonator 100 as a result of the loss of coupling in controlled thickness region 114 is warranted by the overall reduction in energy loss achieved in BAW resonator 100 by reducing electromechanical coupling into unwanted modes in controlled thickness region 114.

Thus, by reducing electromechanical coupling in controlled thickness region 114, a significant reduction in energy loss in BAW resonator 100 can be achieved by reducing electromechanical coupling into unwanted modes, such as lateral modes, in BAW resonator 100. Also, in controlled thickness region 114, width 116 and thickness 118 of low density metal segment 108 and thickness 120 of upper electrode 106 can be appropriately selected to achieve optimal reduction of energy loss in BAW resonator 100.

Thus, by controlling electromechanical coupling in controlled thickness region 114, the embodiment of the invention in FIGS. 1A and 1B can achieve a significant reduction in the amount of energy that is coupled into lossy, unwanted modes, such as lateral modes, compared to a conventional BAW resonator that utilizes profile shaping to reduce energy loss. Thus, by reducing energy loss, the embodiment of the invention's BAW resonator 100 can advantageously provide an increased Q (quality factor) compared to a conventional BAW resonator.

From the above description of the embodiment of invention in FIGS. 1A and 1B, it is manifest to one of ordinary skill in the art that a controlled thickness region, such as controlled thickness region 114, can alternatively be formed between lower electrode 102 and piezoelectric layer 104 in BAW resonator 100 to achieve similar advantages as discussed above.

Figure 2A:
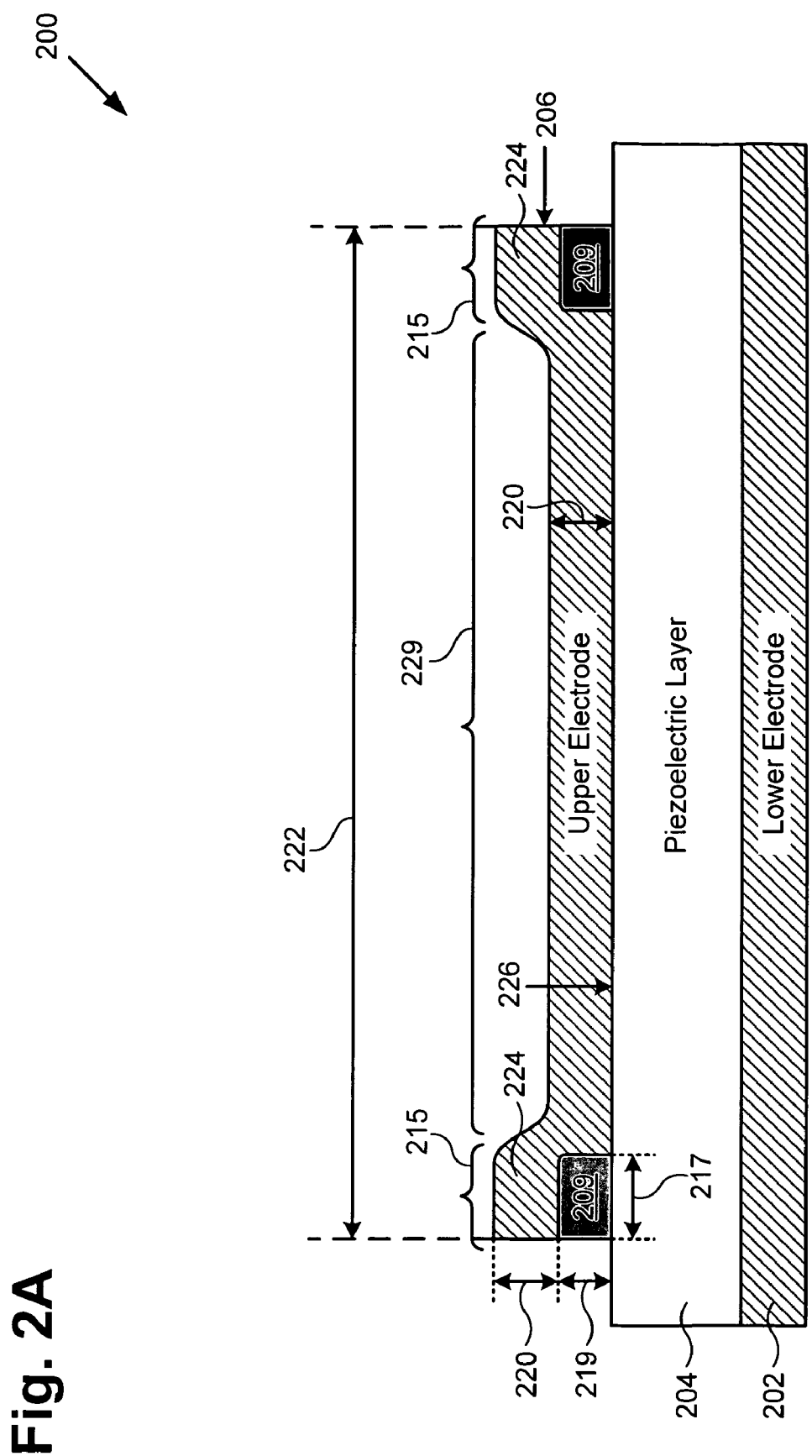
FIG. 2A illustrates a cross-sectional view of an exemplary BAW resonator, in accordance with one embodiment of the present invention.

FIG. 2A shows a cross-sectional view of BAW resonator 200, in accordance with one embodiment of the present invention. Certain details and features have been left out of FIG. 2A, which are apparent to a person of ordinary skill in the art. BAW resonator 200 includes lower electrode 202, piezoelectric layer 204, upper electrode 206, and dielectric segment 209. In FIG. 2A, lower electrode 202, piezoelectric layer 204, upper electrode 206, thickness 220, width 222, and top surface 226 in BAW resonator 200 correspond, respectively, to lower electrode 102, piezoelectric layer 104, upper electrode 106, thickness 120, width 122, and top surface 126 in BAW resonator 100 in FIGS. 1A and 1B. Similar to BAW resonator 100, BAW resonator 200 can further include an acoustic mirror and an underlying substrate, which are not shown in FIG. 2A so as not to obscure the invention. In one embodiment, BAW resonator 200 can be an FBAR and can be acoustically isolated from an underlying substrate by an air cavity. BAW resonator 200 can be utilized in a BAW filter to provide RF filtering in a cellular phone or other type of semiconductor device and can be fabricated in a semiconductor die.

As shown in FIG. 2A, piezoelectric layer 204 is situated over lower electrode 202. Piezoelectric layer 204 and lower electrode 202 can be substantially similar in composition, thickness, and formation as respective piezoelectric layer 104 and lower electrode 102 in BAW resonator 100 in FIG. 1A. Also shown in FIG. 2A, dielectric segment 209 is situated on top surface 226 of piezoelectric layer 204 in controlled thickness region 215 of BAW resonator 200. Dielectric segment 209 is also confined within a perimeter of piezoelectric layer 204. In other words, dielectric segment 209 does not extend beyond the edge of piezoelectric layer 204. In one embodiment, dielectric segment 209 can be situated on the bottom surface of piezoelectric layer 204. However, it is important for dielectric segment 209 to be situated either on (i.e. in direct contact with) the top surface 226 of piezoelectric layer 204 (in the present embodiment) or on the bottom surface of piezoelectric layer 204 (in another embodiment) for effective control of electromechanical coupling in controlled thickness region 215, as will be discussed below.

Dielectric segment 209 can comprise, for example, silicon oxide, silicon nitride, or other suitable dielectric material. In one embodiment, dielectric segment 209 can comprise a "low dielectric constant (low-k) dielectric material," such as porous silica, fluorinated amorphous carbon, fluoro-polymer, parylene, polyarylene ether, hydrogen silsesquioxane (HSQ), fluorinated silicon dioxide, or diamondlike carbon. In the present application, a "low-k dielectric material" is defined as a dielectric material having a dielectric constant that is less than the dielectric constant of silicon oxide.

In the embodiment in FIG. 2A, dielectric segment 209 is situated at the edge of BAW resonator 200, extends along the entire perimeter of the BAW resonator, and has a rectangular cross-sectional shape. In one embodiment, dielectric segment 209 can be situated in close proximity to the edge of BAW resonator 200. In another embodiment, dielectric segment 209 can have a non-rectangular cross-sectional shape. Dielectric segment 209 has width 217, which can be, for example, between 1.0 micron and 5.0 microns. Dielectric segment 209 has thickness 219, which can be, for example, between 100.0 Angstroms and 3000.0 Angstroms. It is noted that although dielectric segment 209 is shown as being thinner than upper electrode 206 for simplicity of illustration, dielectric segment 209 can also be thicker than or approximately equal in thickness to upper electrode 206.

Dielectric segment 209 can be formed by depositing a layer of dielectric material, such as silicon oxide, over piezoelectric layer 204 by utilizing a CVD process or other suitable deposition process. The layer of dielectric material can then be appropriately patterned by utilizing a suitable etch process to form the inner edge of dielectric segment 209 by removing a center portion of the dielectric layer. In the embodiment in FIG. 2A, the outer edge of dielectric segment 209 can be self-aligned with the edge of upper electrode 206 as discussed below. In one embodiment, the layer of dielectric material can be appropriately patterned by utilizing a suitable etch process to form the inner and outer edges of dielectric segment 209. In that embodiment, upper electrode 206 can overlap the outside edge of dielectric segment 209 or be contained entirely within its boundary.

Further shown in FIG. 2A, upper electrode 206 is situated over piezoelectric layer 204 and dielectric segment 209 and can comprise tungsten, molybdenum, or other suitable high density metal. Upper electrode 206 has thickness 220, which can be, for example, between 500.0 Angstroms and 5000.0 Angstroms. Upper electrode 206 has width 222, which can be less than the width of lower electrode 202 and which defines the width of the active portion of BAW resonator 200. In one embodiment, upper electrode 206 and lower electrode 202 can be approximately equal in width. Upper electrode 206 can be formed by depositing a layer of high density metal, such as tungsten or molybdenum, over piezoelectric layer 204 and dielectric segment 209 by utilizing a PVD or sputtering process or other suitable deposition process.

In the embodiment in FIG. 2A, the layer of high density metal can be appropriately patterned by etching the layer of high density metal concurrently with the underlying layer of dielectric material utilized to form dielectric segment 209 so as to precisely define the edge of BAW resonator 200. Thus, in the embodiment in FIG. 2A, the edge of upper electrode 206 is self-aligned with the outer edge of dielectric segment 209. In one embodiment, the layer of high density metal can overlap the outer edge of dielectric segment 209 and can be appropriately patterning by utilizing a suitable etch process to form the edge of upper electrode 206.

Also shown in FIG. 2A, controlled thickness region 215 is situated at the edge of BAW resonator 200, extends along the edge of BAW resonator 200, and includes dielectric segment 209 and portion 224 of upper electrode 206, which overlies dielectric segment 209. In another embodiment, controlled thickness region 215 can be formed at a location in BAW resonator 200 other than at the edge of resonator. In the embodiment in FIG. 2A, controlled thickness region 215 has a uniform cross-sectional thickness. In other embodiments, controlled thickness region 215 can have a non-uniform cross-sectional thickness and a non-rectangular cross-sectional shape, such as, for example, a wedge shape or a teardrop shape. Further shown in FIG. 2A, high density metal region 229 of BAW resonator 200 is situated adjacent to and surrounded by controlled thickness region 215. In high density metal region 229, upper electrode 206 is situated on piezoelectric layer 204. Thus, in high density metal region 229, a dielectric segment, such as dielectric segment 209, is not disposed between upper electrode 206 and piezoelectric layer 204.

Figure 2B:
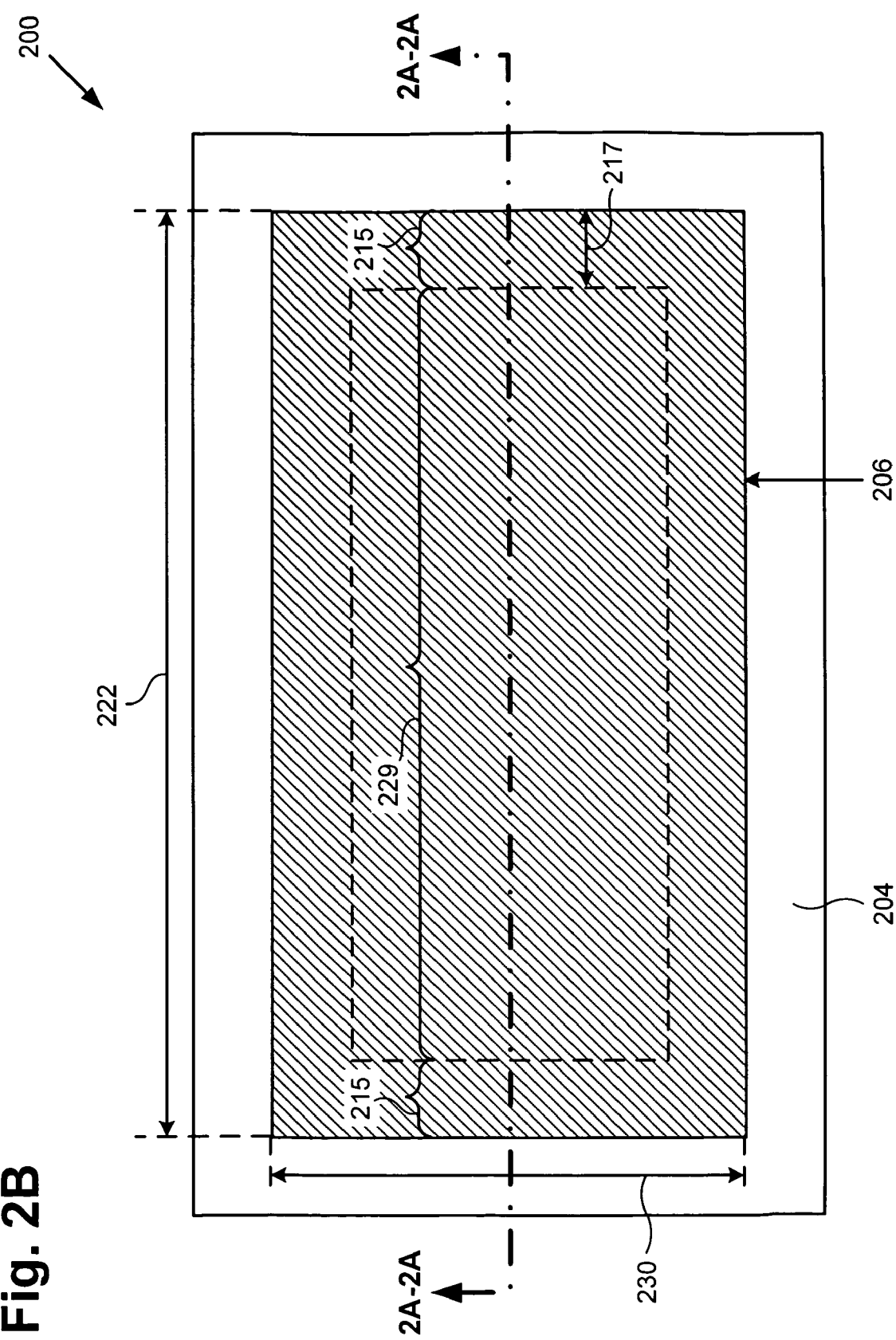
FIG. 2B illustrates a top view of the exemplary BAW resonator of FIG. 2A.

FIG. 2B shows a top view of structure 200, where the cross-sectional view of BAW resonator 200 in FIG. 2A is across line 2A-2A in FIG. 2B. In particular, piezoelectric layer 204, upper electrode 206, controlled thickness region 215, widths 217 and 222, and high density metal region 229 correspond to the same elements in FIG. 2A and FIG. 2B. As shown in FIG. 2B, upper electrode 206 has depth 230, which defines the approximate depth of the active region of BAW resonator 200. In the embodiment in FIGS. 2A and 2B, BAW resonator 200 has a rectangular shape. In one embodiment, BAW resonator 200 can have a square shape, wherein width 222 is approximately equal to depth 230. There can also be advantages to rounding the BAW resonator's corners and/or forming the resonator such that opposite sides of the resonator are not parallel.

As shown in FIG. 2B, controlled thickness region 215 is situated at the edge of BAW resonator 200, extends along the resonator's perimeter, and has a width that is defined by width 217 of dielectric segment 209. Also shown in FIG. 2B, high density metal region 229 of BAW resonator 200 is situated adjacent to and enclosed by controlled thickness region 215.

The operation of BAW resonator 200 will now be discussed. When an electric field is applied across piezoelectric layer 204 via upper electrode 206 and lower electrode 202 of BAW resonator 200, electrical energy is converted into acoustic energy in piezoelectric layer 204 through electromechanical coupling, thereby causing piezoelectric layer 204 to vibrate. As a result, piezoelectric layer 204 can generate acoustic waves in a similar manner as piezoelectric layer 104 as discussed above, thereby generating waves that propagate in a desired longitudinal mode and also generating waves that propagate in unwanted modes, such as lateral modes. In BAW resonator 200, controlled thickness region 215 provides thickness shaping at the edge of BAW resonator 200 by adding dielectric segment 209 between upper electrode 206 and piezoelectric layer 204. Control of electromechanical coupling is also provided by utilizing dielectric segment 209, which operates electrically as a series capacitor to reduce the electric field in controlled thickness region 215. By reducing the electric field in controlled thickness region 215, the electromechanical coupling in controlled thickness region 215 is correspondingly reduced.

By reducing electromechanical coupling in controlled thickness region 215, electromechanical coupling into unwanted modes, such as lateral modes, is reduced as well as coupling into the desired longitudinal mode. However, the overall modest loss of coupling into the longitudinal mode in BAW resonator 200 as a result of the loss of coupling in controlled thickness region 215 is warranted by the overall reduction in energy loss achieved in BAW resonator 200 by reducing electromechanical coupling into unwanted modes in controlled thickness region 215.

Thus, by reducing electromechanical coupling in controlled thickness region 215, a significant reduction in energy loss in BAW resonator 200 can be achieved by reducing electromechanical coupling into unwanted modes, such as lateral modes, in BAW resonator 200. Also, in controlled thickness region 215, width 217 and thickness 219 of dielectric segment 209 and thickness 220 of upper electrode 206 can be appropriately selected to achieve optimal reduction of energy loss in BAW resonator 200.

Thus, by controlling electromechanical coupling in controlled thickness region 215, the embodiment of the invention in FIGS. 2A and 2B can achieve a significant reduction in the amount of energy that is coupled into lossy, unwanted modes, such as lateral modes, compared to a conventional BAW resonator that utilizes profile shaping to reduce energy loss. Thus, by reducing energy loss, the embodiment of the invention's BAW resonator 200 can advantageously provide an increased Q (quality factor) compared to a conventional BAW resonator.

From the above description of the embodiment of invention in FIGS. 2A and 2B, it is manifest to one of ordinary skill in the art that a controlled thickness region, such as controlled thickness region 215, can alternatively be formed such that a dielectric segment, such as dielectric segment 209, is situated between lower electrode 202 and piezoelectric layer 204 in BAW resonator 200 to achieve similar advantages as discussed above.

FIG. 3 shows a flowchart illustrating an exemplary method according to one embodiment of the present invention. Certain details and features have been left out of flowchart 300 that are apparent to a person of ordinary skill in the art. For example, a step may consist of one or more substeps or may involve specialized equipment or materials, as known in the art. It is noted that the processing steps shown in flowchart 300 are performed on a portion of a processed wafer, which, prior to step 302 of flowchart 300, includes, among other things, an acoustic mirror or an air cavity overlying a substrate, which are not shown in any of the figures.

At step 302 of flowchart 300, a lower electrode, such as lower electrode 102 in FIG. 1A or lower electrode 202 in FIG. 2A, of a BAW resonator, such as BAW resonator 100 or BAW resonator 200, is formed over a substrate. In one embodiment, the lower electrode can be formed on an acoustic mirror, which can be situated over the substrate. In another embodiment, the lower electrode can be formed over an air cavity, which can be formed over the substrate. The lower electrode can comprise a high density metal, such as tungsten or molybdenum, and can be formed by utilizing a PVD or sputtering process or other suitable deposition process. At step 304, a piezoelectric layer, such as piezoelectric layer 104 in FIG. 1A or piezoelectric layer 204 in FIG. 2A, can be formed over the lower electrode. The piezoelectric layer can comprise, for example, aluminum nitride and can be formed over the lower electrode by utilizing a PVD or sputtering process or other suitable deposition process.

At step 306, a segment of material, such as low density metal segment 108 in FIG. 1A or dielectric segment 209 in FIG. 2A, is formed over the piezoelectric layer in a controlled thickness region of the BAW resonator, such as controlled thickness region 114 of BAW resonator 100 or controlled thickness region 215 of BAW resonator 200. For example, low density metal segment 108, which can comprise a low density metal such as aluminum or titanium, can be formed over piezoelectric layer 104 in controlled thickness region 114 of BAW resonator 100 by utilizing a PVD or sputtering process. For example, dielectric segment 209, which can comprise a dielectric material such as silicon oxide, silicon nitride, or a low-k dielectric material, can be formed over piezoelectric layer 204 in controlled thickness region 215 of BAW resonator 200 by utilizing a CVD or other suitable deposition process.

At step 308, an upper electrode, such as upper electrode 106 in FIG. 1A or upper electrode 206 in FIG. 2A, is formed over the segment of material, such as low density metal segment 108 or dielectric segment 209, and over the piezoelectric layer, such as piezoelectric layer 104 or 204. For example, upper electrode 106 in BAW resonator 100 in FIGS. 1A and 1B can comprise a high density metal, such as tungsten or molybdenum, and can be formed by depositing a layer of high density metal over low density metal segment 108 and over piezoelectric layer 104 by utilizing a sputtering process and appropriately patterning the high density metal layer. For example, upper electrode 206 in BAW resonator 200 in FIGS. 2A and 2B can comprise a high density metal, such as tungsten or molybdenum, and can be formed by depositing a layer of high density metal over dielectric segment 209 and over piezoelectric layer 204 by utilizing a sputtering process and appropriately patterning the high density metal layer. For example, the layer of high density metal can be etched concurrently with an underlying layer of material such that the edge of the upper electrode, such as upper electrode 106 or 208, is self-aligned with an outer edge of the underlying segment of material, such as an outer edge of respective low density metal segment 108 or dielectric segment 209.

Figure 4:
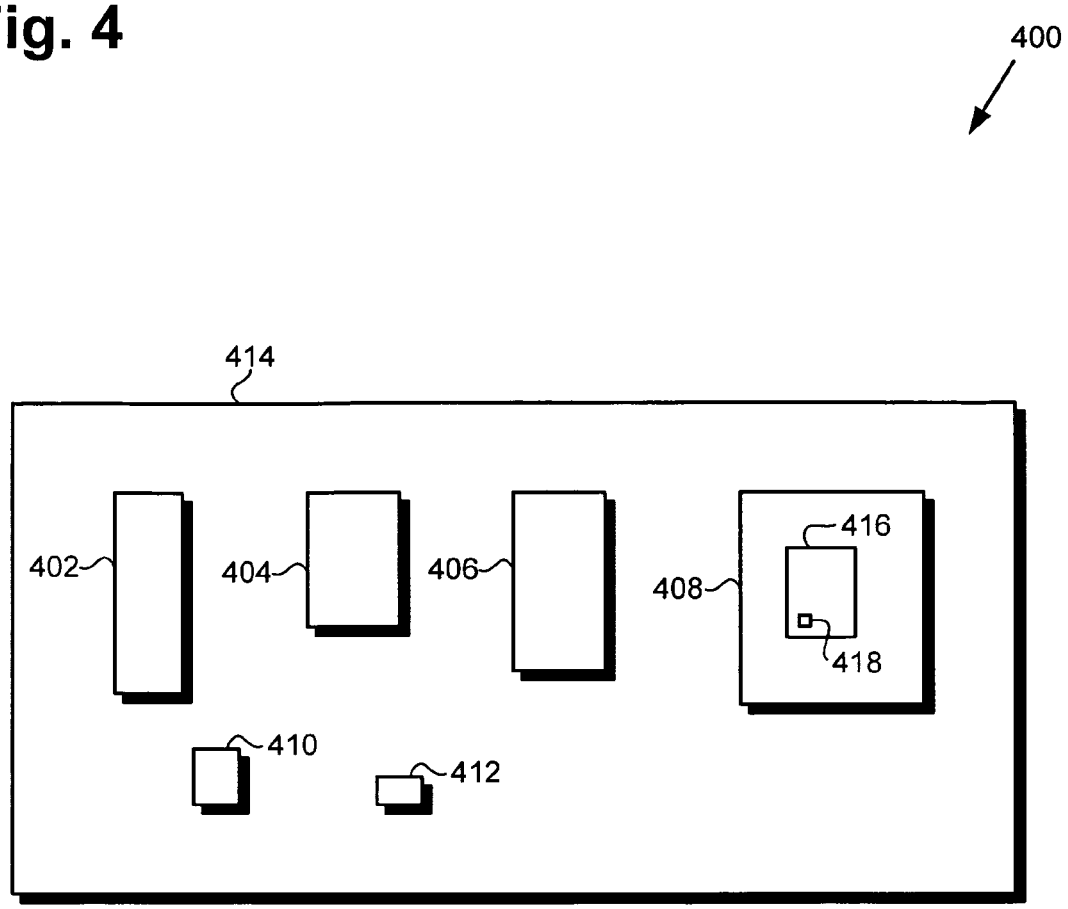
FIG. 4 is a diagram of an exemplary electronic system including an exemplary chip or die utilizing a BAW resonator in accordance with one embodiment of the present invention.

FIG. 4 illustrates a diagram of an exemplary electronic system including an exemplary chip or die utilizing one or more BAW resonators in accordance with one embodiment of the present invention. Electronic system 400 includes exemplary modules 402, 404, and 406, IC chip or semiconductor die 408, discrete components 410 and 412, residing in and interconnected through circuit board 414. In one embodiment, electronic system 400 may include more than one PCB. IC chip 408 includes circuit 416, which can comprise a BAW filter, including one or more of the invention's BAW resonators designated by numeral 418.

As shown in FIG. 4, modules 402, 404, and 406 are mounted on circuit board 414 and can each be, for example, a central processing unit (CPU), a graphics controller, a digital signal processor (DSP), an application specific integrated circuit (ASIC), a video processing module, an audio processing module, an RF receiver, an RF transmitter, an image sensor module, a power control module, an electromechanical motor control module, or a field programmable gate array (FPGA), or any other kind of module utilized in modern electronic circuit boards. Circuit board 414 can include a number of interconnect traces (not shown in FIG. 4) for interconnecting modules 402, 404, and 406, discrete components 410 and 412, and IC chip 408.

Also shown in FIG. 4, IC chip 408 is mounted on circuit board 414 and can be, for example, any chip utilizing one or more of an embodiment of the invention's BAW resonator, such as BAW resonator 100 in FIGS. 1A and 1B or BAW resonator 200 in FIGS. 2A and 2B. In one embodiment, IC chip 408 may not be mounted on circuit board 414, and may be interconnected with other modules on different circuit boards. As stated above, circuit 416 is situated in IC chip 408 and can comprise a BAW filter including one or more of the invention's BAW resonators designed by numeral 418. Further shown in FIG. 4, discrete components 410 and 412 are mounted on circuit board 414 and can each be, for example, a discrete filter, such as one including a SAW filter or the like, a power amplifier or an operational amplifier, a semiconductor device, such as a transistor or a diode or the like, an antenna element, an inductor, a capacitor, or a resistor.

Electronic system 400 can be utilized in, for example, a wired or wireless communications device, a cell phone, a switching device, a router, a repeater, a codec, a wired or wireless LAN, a WLAN, a Bluetooth enabled device, a Global Positioning System (GPS) device, a computer, a monitor, a television set, a satellite set top box, a cable modem, a printer, a copier, an RF transceiver, a personal digital assistant (PDA), or in any other kind of system, device, component or module utilized in modern electronics applications.

Thus, as discussed above, in the embodiments in FIGS. 1A and 1B and 2A and 2B, the invention provides a BAW resonator including a controlled thickness region, wherein the controlled thickness region provides a shaped thickness and controlled electromechanical coupling. By utilizing a controlled thickness region to reduce electromechanical coupling at the edge of the BAW resonator, the invention's BAW resonator advantageously achieves a significant reduction in energy loss by significantly decreasing electromechanical coupling into unwanted, lossy modes compared to a conventional BAW resonator utilizing only profile shaping to reduce energy loss. As a result, the invention's BAW resonator advantageously achieves a higher Q compared to the conventional BAW resonator.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

Thus, a bulk acoustic wave resonator with controlled thickness region having controlled electromechanical coupling has been described.

The invention claimed is:
1. A bulk acoustic wave (BAW) resonator comprising:
a piezoelectric layer situated between upper and lower electrodes, said upper and lower electrodes each comprising a high density metal;
a controlled thickness region comprising a low density metal segment, said low density metal segment being situated adjacent to said piezoelectric layer;
wherein said controlled thickness region has a controlled electromechanical coupling.

2. The BAW resonator of claim 1, wherein said controlled thickness region provides reduced electromechanical coupling into lateral modes.

3. The BAW resonator of claim 1, wherein said low density metal segment is situated between said upper electrode and said piezoelectric layer.

4. The BAW resonator of claim 1, wherein said low density metal segment extends along a perimeter of said BAW resonator.

5. The BAW resonator of claim 3, wherein an edge of said upper electrode is self-aligned with an outside edge of said low density metal segment.

6. The BAW resonator of claim 3, wherein an edge of said upper electrode overlaps an outside edge of said low density metal segment.

7. The BAW resonator of claim 1, wherein said low density metal segment comprises a metal selected from the group consisting of aluminum and titanium.

8. A method of forming a BAW resonator, said method comprising:
   forming a piezoelectric layer over a lower electrode of said BAW resonator;
   forming a low density metal segment over said piezoelectric layer in a controlled thickness region of said BAW resonator, said controlled thickness region having a controlled electromechanical coupling;
   forming an upper electrode of said BAW resonator over said low density metal segment, said upper electrode comprising a high density metal.

9. The method of claim 8, wherein said controlled thickness region provides reduced electromechanical coupling into lateral modes.

10. The method of claim 8, wherein said low density metal segment extends along a perimeter of said BAW resonator.

11. The method of claim 8, wherein said forming said upper electrode comprises forming an edge of said upper electrode concurrently with an outer edge of said low density metal segment.

12. The method of claim 8, wherein said upper electrode overlaps an outside edge of said low density metal segment.

13. The method of claim 8, wherein said low density metal segment comprises a metal selected from the group consisting of aluminum and titanium.

14. A bulk acoustic wave (BAW) resonator comprising:
   a piezoelectric layer situated between upper and lower electrodes;
   a controlled thickness region comprising a dielectric segment, said dielectric segment being situated in contact with said piezoelectric layer, said dielectric segment being confined within a perimeter of said piezoelectric layer;
   wherein said controlled thickness region has a controlled electromechanical coupling.

15. The BAW resonator of claim 14, wherein said controlled thickness region provides reduced electromechanical coupling into lateral modes.

16. The BAW resonator of claim 14, wherein said dielectric segment is situated between said upper electrode and said piezoelectric layer.

17. The BAW resonator of claim 16, wherein an edge of said upper electrode is aligned with an outer edge of said dielectric segment.

18. The BAW resonator of claim 14, wherein said dielectric segment comprises a low-k dielectric material.

19. The BAW resonator of claim 18, wherein said low-k dielectric material is selected from the group consisting of porous silica, fluorinated amorphous carbon, fluoro-polymer, parylene, polyarylene ether, hydrogen silsesquioxane (HSQ), fluorinated silicon dioxide, and diamondlike carbon.

20. The BAW resonator of claim 14, wherein said dielectric segment is situated at an edge of said BAW resonator.

* * * * *